(12) United States Patent
Feustel et al.

(10) Patent No.: US 9,245,860 B2
(45) Date of Patent: Jan. 26, 2016

(54) METALLIZATION SYSTEM OF A SEMICONDUCTOR DEVICE INCLUDING METAL PILLARS HAVING A REDUCED DIAMETER AT THE BOTTOM

(75) Inventors: Frank Feustel, Dresden (DE); Kai Frohberg, Niederau (DE); Thomas Werner, Moritzburg (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 944 days.

(21) Appl. No.: 12/710,458

(22) Filed: Feb. 23, 2010

(65) Prior Publication Data

US 2010/0219527 A1  Sep. 2, 2010

(30) Foreign Application Priority Data

Feb. 27, 2009  (DE) .......................... 10 2009 010 885

(51) Int. Cl.
*H01L 23/488* (2006.01)
*H01L 21/60* (2006.01)
*H01L 23/00* (2006.01)

(52) U.S. Cl.
CPC ................ *H01L 24/03* (2013.01); *H01L 24/05* (2013.01); *H01L 24/11* (2013.01); *H01L 24/12* (2013.01); *H01L 2224/0401* (2013.01); *H01L 2224/05001* (2013.01); *H01L 2224/05082* (2013.01); *H01L 2224/05093* (2013.01); *H01L 2224/05096* (2013.01); *H01L 2224/05624* (2013.01); *H01L 2224/05647* (2013.01); *H01L 2224/1147* (2013.01); *H01L 2224/11462* (2013.01); *H01L 2224/11464* (2013.01); *H01L 2224/11472* (2013.01); *H01L 2224/11474* (2013.01); *H01L 2224/11849* (2013.01);
(Continued)

(58) Field of Classification Search
CPC .............................. H01L 23/488; H01L 21/60
USPC .................. 257/737, 738, 750, 773, E21.509, 257/E23.023; 438/611, 614, 737, 739, 615
See application file for complete search history.

(56) References Cited

U.S. PATENT DOCUMENTS 5,137,597 A * 8/1992 Curry et al. ..................... 216/38
5,380,679 A * 1/1995 Kano ............................ 438/628
(Continued)

FOREIGN PATENT DOCUMENTS

JP        2002076046 A     3/2002

OTHER PUBLICATIONS

Translation of Official Communication from German Patent Office for German Patent Application No. 10 2009 010 885.8-33 dated Apr. 28, 2010.
(Continued)

*Primary Examiner* — Sheng Zhu (57) ABSTRACT

In a metallization system of a complex semiconductor device, metal pillars, such as copper pillars, may be formed in a nail-like configuration in order to reduce the maximum mechanical stress acting on the metallization system while providing a required contact surface for connecting to the package substrate. The nail-like configuration may be obtained on the basis of appropriately configured resist masks.

25 Claims, 6 Drawing Sheets

(52) U.S. Cl.
CPC . *H01L 2224/11901* (2013.01); *H01L 2224/131* (2013.01); *H01L 2224/13006* (2013.01); *H01L 2224/1308* (2013.01); *H01L 2224/13022* (2013.01); *H01L 2224/13082* (2013.01); *H01L 2224/13147* (2013.01); *H01L 2924/00013* (2013.01); *H01L2924/014* (2013.01); *H01L 2924/01005* (2013.01); *H01L 2924/01013* (2013.01); *H01L 2924/01014* (2013.01); *H01L 2924/01019* (2013.01); *H01L 2924/01024* (2013.01); *H01L 2924/01028* (2013.01); *H01L 2924/01029* (2013.01); *H01L 2924/01032* (2013.01); *H01L 2924/01033* (2013.01); *H01L 2924/01047* (2013.01); *H01L 2924/01057* (2013.01); *H01L 2924/01068* (2013.01); *H01L 2924/01073* (2013.01); *H01L 2924/01078* (2013.01); *H01L 2924/01082* (2013.01); *H01L 2924/04953* (2013.01); *H01L 2924/05042* (2013.01); *H01L 2924/10253* (2013.01); *H01L 2924/1306* (2013.01); *H01L 2924/14* (2013.01); *H01L 2924/1433* (2013.01); *H01L 2924/19041* (2013.01); *H01L 2924/19043* (2013.01); *H01L 2924/3025* (2013.01); *H01L 2924/30105* (2013.01); *H01L 2924/351* (2013.01)

(56) References Cited

U.S. PATENT DOCUMENTS

| | | | |
|---|---|---|---|
| 5,550,427 A | | 8/1996 | Hayashi |
| 5,656,858 A | * | 8/1997 | Kondo et al. ............... 257/737 |
| 5,773,897 A | | 6/1998 | Wen et al. .................. 257/778 |
| 5,912,510 A | | 6/1999 | Hwang et al. .............. 257/778 |
| 6,103,552 A | * | 8/2000 | Lin ............................. 438/113 |
| 6,159,837 A | * | 12/2000 | Yamaji et al. .............. 438/613 |
| 6,180,265 B1 | * | 1/2001 | Erickson .................... 428/652 |
| 6,818,545 B2 | * | 11/2004 | Lee et al. ................... 438/614 |
| 2002/0121692 A1 | | 9/2002 | Lee et al. |
| 2004/0082161 A1 | | 4/2004 | Ho et al. .................... 438/614 |
| 2005/0253264 A1 | | 11/2005 | Aiba et al. |
| 2006/0088992 A1 | | 4/2006 | Huang et al. ............... 438/614 |
| 2008/0303142 A1 | | 12/2008 | Kim et al. .................. 257/737 |

OTHER PUBLICATIONS

PCT International Search Report from PCT/EP2010/001092 dated May 6, 2010.

PCT International Preliminary Report on Patentability and Written Opinion from PCT/EP2010/001092 dated Aug. 30, 2011.

* cited by examiner

METALLIZATION SYSTEM OF A SEMICONDUCTOR DEVICE INCLUDING METAL PILLARS HAVING A REDUCED DIAMETER AT THE BOTTOM

BACKGROUND OF THE INVENTION

1. Field of the Invention

Generally, the present disclosure relates to integrated circuits having metallization systems including metal pillars, and, more particularly, to the techniques for reducing chip-package interactions caused by thermal mismatch between the chip and the package.

2. Description of the Related Art

Semiconductor devices are typically formed on substantially disc-shaped substrates made of any appropriate material. The majority of semiconductor devices including highly complex electronic circuits are currently, and in the foreseeable future will be, manufactured on the basis of silicon, thereby rendering silicon substrates and silicon-containing substrates, such as silicon-on-insulator (SOI) substrates, viable base materials for forming semiconductor devices, such as microprocessors, SRAMs, ASICs (application specific ICs), systems on chip (SoC) and the like. The individual integrated circuits are arranged in an array on the wafer, wherein most of the manufacturing steps, which may involve several hundred and more individual process steps in sophisticated integrated circuits, are performed simultaneously for all chip areas on the substrate, except for photolithography processes, metrology processes and packaging of the individual devices after dicing the substrate. Thus, economical constraints drive semiconductor manufacturers to steadily increase the substrate dimensions, thereby also increasing the area available for producing actual semiconductor devices and thus increasing production yield.

In addition to increasing the substrate area, it is also important to optimize the utilization of the substrate area for a given substrate size so as to actually use as much substrate area as possible for semiconductor devices and/or test structures that may be used for process control. In an attempt to maximize the useful surface area for a given substrate size, the feature sizes of circuit elements are steadily scaled down. Due to this ongoing demand for shrinking the feature sizes of highly sophisticated semiconductor devices, copper, in combination with a low-k dielectric material, has become a frequently used alternative in the formation of so-called interconnect structures comprising metal line layers and intermediate via layers that include metal lines as intra-layer connections and vias as inter-layer connections, which commonly connect individual circuit elements to provide the required functionality of the integrated circuit. Typically, a plurality of metal line layers and via layers stacked on top of each other is necessary to realize the connections between all internal circuit elements and I/O (input/output), power and ground pads of the circuit design under consideration.

For extremely scaled integrated circuits, the signal propagation delay is no longer limited by the circuit elements, such as field effect transistors and the like, but is limited, owing to the increased density of circuit elements requiring an even more increased number of electrical connections, by the close proximity of the metal lines, since the line-to-line capacitance is increased in combination with a reduced conductivity of the lines due to a reduced cross-sectional area. For this reason, traditional dielectrics, such as silicon dioxide (k>4) and silicon nitride (k>7), are replaced by dielectric materials having a lower permittivity, which are, therefore, also referred to as low-k dielectrics having a relative permittivity of 3 or less. However, the density and mechanical stability or strength of the low-k materials may be significantly less compared to the well-approved dielectrics silicon dioxide and silicon nitride. As a consequence, during the formation of the metallization system and any subsequent manufacturing processes of integrated circuits, production yield may depend on the mechanical characteristics of sensitive dielectric materials, such as low-k dielectric layers, and their adhesion to other materials.

In addition to the problems of reduced mechanical stabilities of advanced dielectric materials having a dielectric constant of 3.0 and significantly less, device reliability may be affected by these materials during operation of sophisticated semiconductor devices, due to an interaction between the chip and the package caused by a thermal mismatch of the corresponding thermal expansion of the different materials. For instance, in the fabrication of complex integrated circuits, increasingly, a contact technology may be used in connecting the package carrier to the chip, which is known as flip chip packaging technique. Contrary to the well-established wire bonding techniques in which appropriate contact pads may be positioned at the periphery of the very last metal layer of the chip that may be connected to corresponding terminals of the package by a wire, in the flip chip technology, a respective bump structure may be formed on the last metallization layer, for instance comprised of a solder material, which may be brought into contact with respective contact pads of the package. Thus, after reflowing the bump material, a reliable electrical and mechanical connection may be established between the last metallization layer and the contact pads of the package carrier. In this manner, a very large number of electrical connections may be provided across the entire chip area of the last metallization layer with reduced contact resistance and parasitic capacitance, thereby providing the IO (input/output) capabilities, which may be required for complex integrated circuits, such as CPUs, storage memories and the like. During the corresponding process sequence for connecting the bump structure with a package carrier, a certain degree of pressure and/or heat may be applied to the composite device to establish a reliable connection between each of the bumps formed on the chip and the bumps or pads that may be provided on the package substrate. The thermally or mechanically induced stress may, however, also act on the lower lying metallization layers, which may typically include low-k dielectrics or even ultra low-k (ULK) dielectric materials, thereby significantly increasing the probability of creating defects by delamination of these sensitive materials due to reduced mechanical stability and adhesion to other materials.

Moreover, during operation of the finished semiconductor device attached to a corresponding package substrate, significant mechanical stress may occur due to a significant mismatch in the thermal expansion behavior of the silicon-based semiconductor chip and the package substrate, since, in volume production of sophisticated integrated circuits, economic constraints typically require the usage of specified substrate materials for the package, such as organic materials, which typically may exhibit a different thermal conductivity and a different coefficient of thermal expansion compared to the silicon chip.

In recent developments, the thermal and electrical performance of a "bump structure" is increased by providing copper pillars instead of or in addition to solder bumps or balls, thereby reducing the required floor space for individual contact elements and also enhancing thermal and electrical conductivity due to the superior characteristics of copper compared to typically used solder material. These copper pillars may, however, contribute to an even more severe interaction between the package and the metallization system of the chip, since, typically, the copper pillars are significantly less deformable compared to the bump structures, which may be advantageous in view of electrical and thermal behavior, which, however, may result in even increased mechanical stress components in a locally very restricted manner, as will be described in more detail with reference to FIGS. 1a-1b.

Figure 1A:
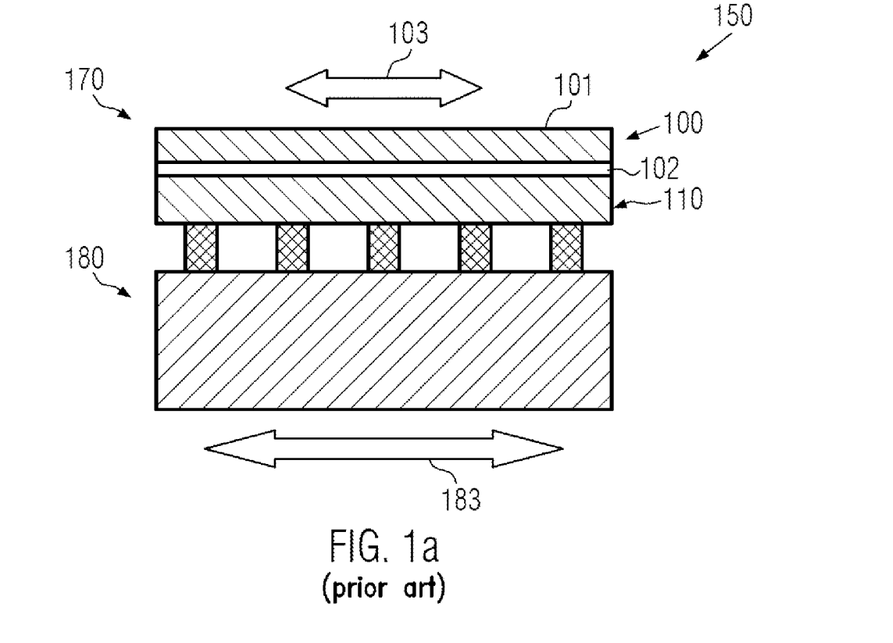
FIGS. 1a-1b schematically illustrate cross-sectional views of an integrated circuit including a semiconductor chip and a package substrate connected by a pillar structure having a conventional configuration, thereby creating a high mechanical stress.

FIG. 1a schematically illustrates a cross-sectional view of an integrated circuit 150 comprising a semiconductor die or chip 100 connected to a package substrate 180 that is substantially comprised of an organic material, such as appropriate polymer materials and the like, wherein the connection between the chip 100 and the package substrate 180 may be accomplished by means of a pillar structure 170. The semiconductor chip 100 may typically comprise a substrate 101, for instance a silicon substrate or an SOI substrate, depending on the overall configuration of the circuit layout and the performance of the integrated circuit 150. Moreover, a silicon-based semiconductor layer 102 may typically be provided "above" the substrate 101, wherein the semiconductor layer 102 may comprise a very large number of circuit elements, such as transistors, capacitors, resistors and the like, as are required for the desired functional behavior of the integrated circuit 150. As previously discussed, the ongoing shrinkage of critical dimensions of circuit elements may result in critical dimensions of transistors on the order of magnitude of 50 nm and significantly less in presently available sophisticated semiconductor devices produced by volume production techniques. The semiconductor chip 100 comprises a metallization system 110, which, in advanced devices, includes a plurality of metallization layers, i.e., of device levels, in which metal lines and vias are embedded in an appropriate dielectric material. As discussed above, at least a portion of the corresponding dielectric materials used in the various metallization layers is usually comprised of materials of reduced mechanical stability in order to reduce the parasitic capacitance of adjacent metal lines.

As previously explained, the pillar structure 170 may be provided as a part of the metallization system 110, wherein the corresponding copper pillars are formed in the very last metallization layer of the system 110. On the other hand, the package substrate 180 comprises appropriately positioned and dimensioned contact pads (not shown) which may be brought into contact with corresponding pillars or any solder material formed thereon, in order to establish respective mechanical and electrical connections upon application of heat and/or mechanical pressure. Furthermore, the package substrate 180 usually comprises appropriate conductive lines in order to connect the upper pillar portions of the pillar structure 170 with corresponding terminals, which then establish an electrical interface to other peripheral components, such as a printed wiring board and the like. For convenience, any such conductive lines are not shown.

During operation of the integrated circuit 150, heat is generated within the semiconductor chip 100, for instance caused by the circuit elements formed in and above the semiconductor layer 102. This waste heat is dissipated, for instance, by the metallization system 110 and the pillar structure 170 in a highly efficient manner and/or via the substrate 101, depending on the overall thermal conductivity of the substrate 101. For example, the heat dissipation capability of SOI substrates is significantly less compared to pure silicon substrates due to the reduced thermal conductivity of the buried insulating oxide layer, which separates the semiconductor layer 102 from the remaining substrate material. Thus, a major heat dissipation path is provided by the pillar structure 170 and the package substrate 180. Consequently, a moderately high average temperature is created in the semiconductor chip 100 and also in the package substrate 180 wherein, as previously discussed, a mismatch in the coefficient of thermal expansion between these two components may cause a significant mechanical stress. As is, for instance, indicated by arrows 103 and 183, the package substrate 180 may have an increased thermal expansion compared to the semiconductor chip 100, wherein a corresponding mismatch, therefore, results in a significant degree of thermal stress, in particular at the "interface" between the semiconductor chip 100 and the package substrate 180, that is, in particular, the pillar structure 170 and the metallization system 110 may experience significant shear forces caused by the thermal mismatch during the operation of the integrated circuit 150. Due to the reduced mechanical stability and the reduced adhesion of sophisticated dielectric materials, corresponding defects may occur, which may affect the overall reliability of the integrated circuit 150. In particular, the stiffness of the individual pillars of the pillar structure 170 may result in locally high shear forces, which are transferred into the metallization system, however, in a locally very restricted area, resulting in delamination defects and the like.

Figure 1B:
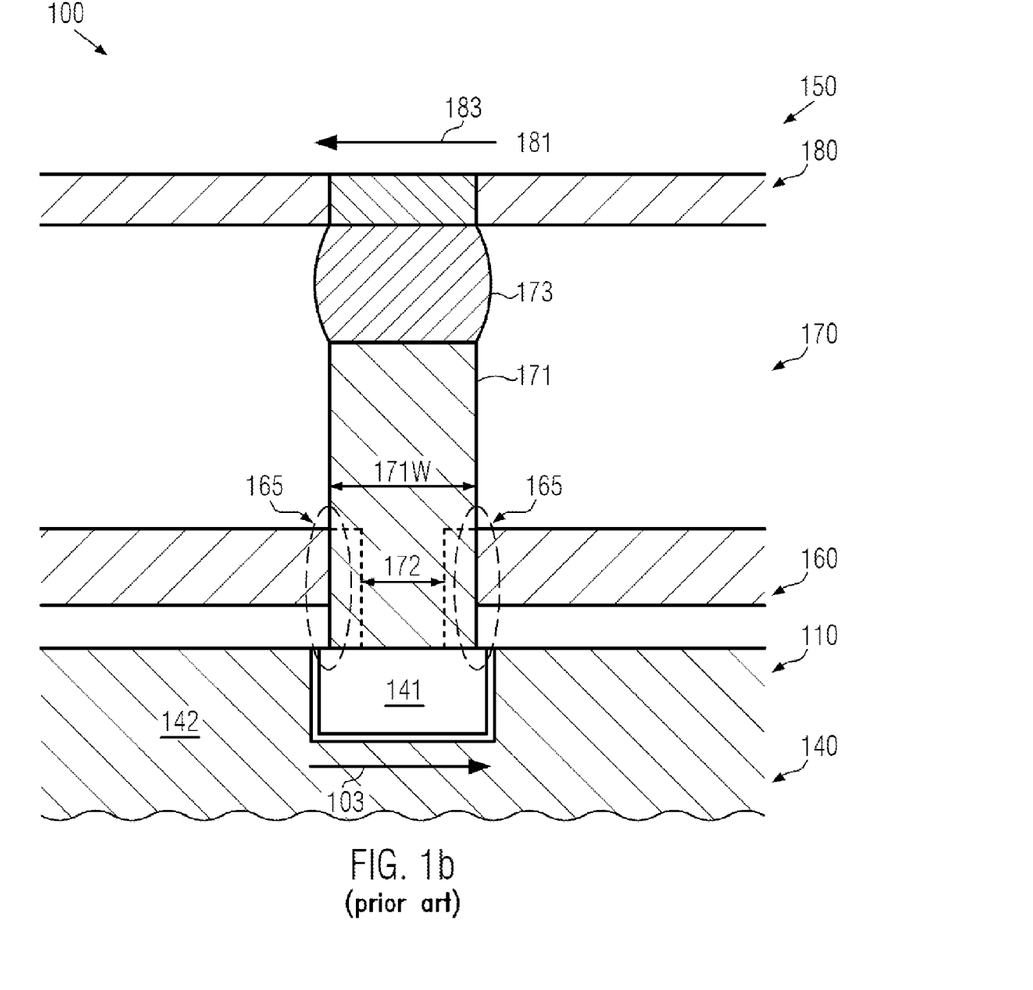

FIG. 1b schematically illustrates a portion of the integrated circuit 150 in order to illustrate the situation during the occurrence of a significant thermal mismatch between the package substrate 180 and the semiconductor chip 100. As illustrated, a portion of the metallization system 110 may be illustrated in which a last metallization layer 140 may comprise a dielectric material 142, in which is embedded a contact pad 141, which may comprise copper material in sophisticated applications. Furthermore a passivation layer 160, which may also be referred to as a final passivation layer, is provided on the last metallization layer 140 and exposes a portion of the contact pad 141. Moreover, a metal pillar 171, such as a copper pillar, may extend from the final passivation layer 160 to the package substrate 180, i.e., a corresponding contact pad 181 formed therein. Moreover, typically, a solder material 173 may be formed on the metal pillar 171 and may connect to the contact pad 181. Moreover, as illustrated by the dashed lines, usually, the opening formed in the final passivation layer 160 may be less than a width 171W of the metal pillar 171, thereby forming a contact region 172 that connects the metal pillar 171 with the contact pad 141. Consequently, during operation, the shear forces 183, 103 may result in a certain torque, in particular generated at corresponding portions 165, at which the bottom of the metal pillar 171 is in contact with the final passivation layer 160. Consequently, in this area, a maximum mechanical stress may be exerted in a locally selective manner to the metallization system 110, thereby forcing corresponding defects that may primarily originate from the areas 165.

Consequently, although advanced contact regimes between a chip and a package substrate based on copper pillars may provide significant advantages with respect to heat dissipation capabilities and electrical conductivity at a reduced required floor space, thereby enhancing density of contact elements and/or dummy elements for heat dissipation, the increased mechanical stress created in the metallization system 110 may not be compatible with the reliability requirements of sophisticated semiconductor devices. For this reason, frequently, the height of the copper pillars is reduced which, however, may be associated with a corresponding reduction of the spacing between the package substrate and the chip, which in turn may cause non-reliable filling in of any underfill material. Thus, corresponding voids in the underfill material may also contribute to a high degree of non-reliability, for instance caused by non-uniformities in heat conductivity and the like. In other conventional approaches, the metallization systems may be formed on the basis of less sensitive low-k dielectric materials or ultra low-k materials in order to enhance the mechanical stability of the metallization system, which, however, is associated with a significant reduction in electrical performance due to increased parasitic capacitances, resulting in an increased signal propagation delay.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to semiconductor devices and manufacturing techniques in which the negative effect of mechanical stress transferred to the metallization system via a pillar structure may be reduced by reducing the maximum forces at the point wherein the metal pillar is in contact with the final passivation layer, while nevertheless maintaining the required contact area at the top of the metal pillar. To this end, in some illustrative aspects disclosed herein, the lateral dimension of the metal pillar at the top thereof may be selected so as to comply with requirements in view of connecting to a package substrate, while, on the other hand, the lateral dimension of the metal pillar at the bottom thereof, i.e., at a height corresponding to the surface of the final passivation layer, may be significantly reduced, thereby also reducing the "point-like" stress transferred into the metallization system. Consequently, the metal pillar may be provided in nail-like configuration, which may be accomplished by appropriately modifying the process of metal deposition, however, without significantly contributing to overall process complexity.

One illustrative semiconductor device disclosed herein comprises a metallization system formed above a substrate and comprising a final passivation layer. Moreover, the semiconductor device comprises a metal pillar extending from the final passivation layer, wherein the metal pillar is in contact with a contact pad formed in the metallization system. Furthermore, the metal pillar has a first lateral dimension at the final passivation layer and has a second lateral dimension at the top surface thereof, wherein the first lateral dimension is less than the second lateral dimension.

One illustrative method disclosed herein comprises forming a first deposition mask above a final passivation layer of a metallization system of a semiconductor device, wherein the first deposition mask has a first opening with a first width. Additionally, the method comprises forming a second deposition mask above the first deposition mask, wherein the second deposition mask has a second opening aligned to the first opening with a second width that is greater than the first width. Finally, the method comprises forming a metal pillar using the first and second deposition masks.

A further illustrative method disclosed herein relates to forming a semiconductor device. The method comprises forming a final passivation layer above a plurality of metallization layers and forming an opening in the final passivation layer to expose a portion of a contact pad. Additionally, the method comprises forming a metal pillar so as to extend from the final passivation layer, wherein the metal pillar has a first lateral dimension at the top surface of the final passivation layer and has a second lateral dimension at a top surface thereof, wherein the first lateral dimension is less than the second lateral dimension by at least 30 percent relative to the second lateral dimension.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and techniques in which sophisticated metallization systems including metal pillars may be efficiently used without unduly increasing the local stress load for the metallization system, thereby providing the possibility of using highly sophisticated dielectric materials, which may have a reduced mechanical stability compared to conventional dielectrics, as previously explained. The local stress load or forces may be efficiently reduced for given requirements with respect to providing a contact surface area for connecting to a package substrate by reducing the torque forces acting on the final passivation layer, which may be accomplished by appropriately reducing the lateral dimension or width or diameter of the metal pillar at an area which is in contact with the final passivation layer, while providing a desired greater width at least at a top surface of the metal pillar. Consequently, the existing torque forces at the interface between the metal pillar and the dielectric material of the final passivation layer may be reduced, thereby also reducing the local load of any underlying materials, such as sensitive low-k dielectric materials, thereby enhancing overall stability during the manufacturing process for connecting the semiconductor chip with the package substrate and also during operation of the integrated circuit, as discussed above. In some illustrative embodiments disclosed herein, the reduced lateral dimension or width of the metal pillar may be selected such that this lateral dimension also substantially corresponds to the lateral dimension of a connection area connecting the metal pillar with a contact pad of the last metallization layer, while in other cases the connection area may be formed on the basis of a desired diameter followed by a lower portion of the metal pillar having greater width, however, significantly reduced compared to conventional pillar structures, followed by an upper portion of the metal pillar having the required greater lateral dimension in order to comply with requirements in view of connectivity and the like.

With reference to FIGS. 2a-2e, further illustrative embodiments will now be described in more detail, wherein reference may also be made to FIGS. 1a-1b, if appropriate.

Figure 2A:
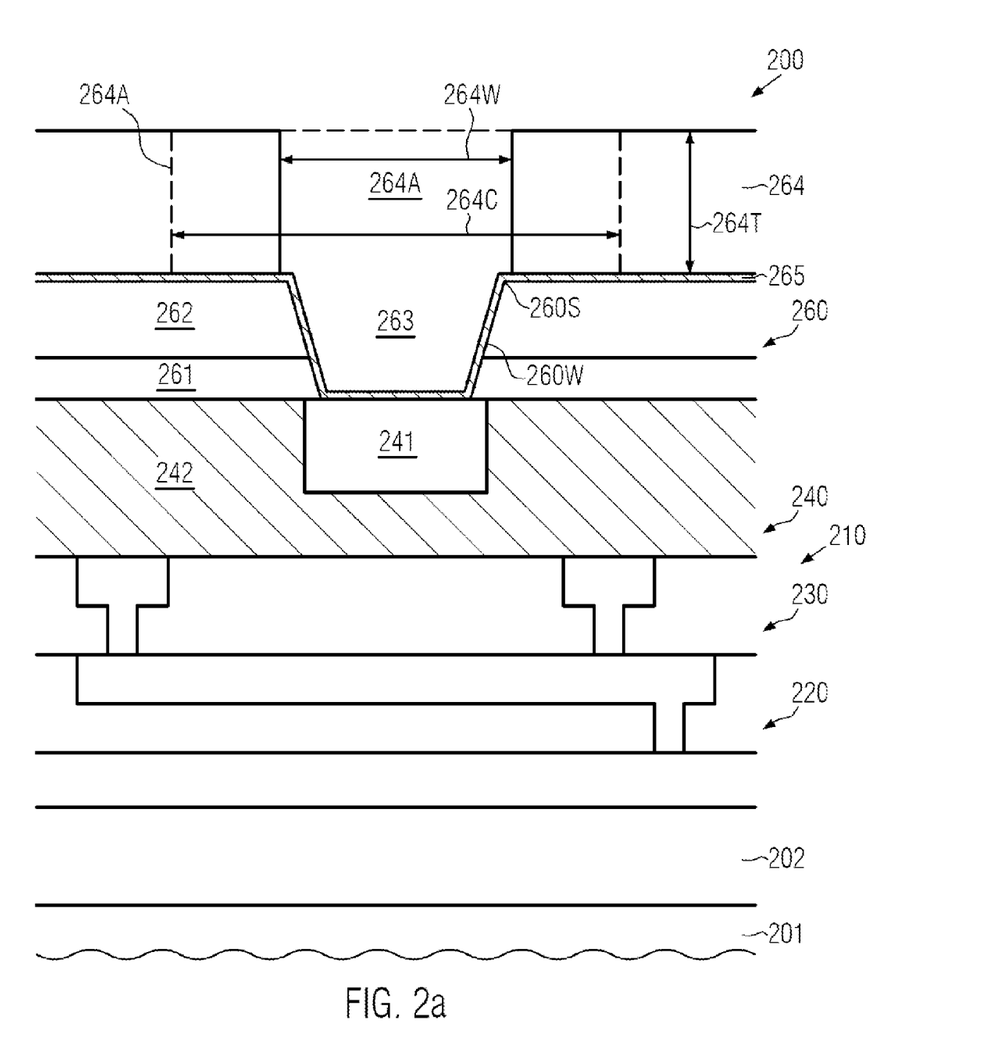
FIGS. 2a-2g schematically illustrate cross-sectional views of a semiconductor device including a sophisticated metallization system and a pillar structure with metal pillars having a "nail-like" configuration for reducing the maximum stress component at the metallization system while nevertheless providing the required connectivity to a package substrate, according to illustrative embodiments.

FIG. 2a schematically illustrates a cross-sectional view of a semiconductor device 200 in an advanced manufacturing stage. As illustrated, the semiconductor device 200 may comprise a substrate 201, such as a silicon substrate, an SOI substrate and the like, as is required in view of the overall configuration of the device 200. Furthermore, a device level or a semiconductor layer 202 may be formed above the substrate 201 and may comprise a large number of circuit elements, such as transistors, capacitors, resistors and the like, which may be formed on the basis of appropriate design rules corresponding to the device 200. For instance, critical dimensions of circuit elements in the device level 202 may be approximately 50 nm and less, thereby also requiring a sophisticated metallization system. It should be appreciated that, although the techniques disclosed herein are highly advantageous in the context of complex semiconductor devices, a corresponding regime for forming a pillar structure may also be advantageously applied to less critical semiconductor devices in which the circuit elements may have critical dimensions of 50 nm and more.

Moreover, the semiconductor device 200 may comprise a metallization system 210, which typically includes a plurality of metallization layers 220, 230, 240, at least some of which, in some illustrative embodiments, comprise sensitive dielectric materials, as previously discussed. Moreover, a last metallization layer 240 may have formed therein a metal region in the form of a contact pad 241, which may be comprised of any appropriate material, such as copper, aluminum, copper/aluminum and the like. It should be appreciated that, in sophisticated metallization systems, the metal lines and vias may be provided on the basis of a copper material due to the superior characteristics in view of thermal and electrical conductivity, as is also previously discussed. It should be noted, however, that metallization systems including other materials, such as aluminum, silver and the like, possibly in combination with other metals, may also be contemplated herein. Moreover, the contact pad 241 may comprise any appropriate barrier material, if required, in order to reliably confine a corresponding metal, such as copper, when a direct contact of the metal with a surrounding dielectric material 242 may be considered inappropriate.

Furthermore, a final passivation layer 260 may be formed above the last metallization layer 240 and may comprise two or more sub-layers 261, 262, as is required in view of the overall characteristics with respect to passivation, mechanical integrity and the like. For example, the first sub-layer 261 may be comprised of silicon dioxide, silicon nitride and the like, while the second sub-layer 262 may represent a passivating material, such as polyamide and the like. In the manufacturing stage shown, an opening 263 may be formed in the final passivation layer 260 so as to extend to the contact pad 241, wherein a corresponding lateral dimension of the opening 263, as well as a thickness of the final passivation layer 260, may be selected in accordance with well-established process strategies so that the corresponding characteristics of the final passivation layer 260 and of the opening 263 may be compatible with conventional strategies for forming a pillar above the final passivation layer 260. In other cases, the width of the opening may be selected less compared to conventional design strategies, if desired.

Furthermore, a first deposition mask 264 may be provided so as to define the position and the lateral size of a first portion of a metal pillar to be formed on the basis of the mask 264. To this end, the deposition mask 264 may comprise an opening 264A having an appropriately selected lateral dimension or width 264W, which may be significantly less compared to a conventional metal pillar for otherwise identical device requirements. For instance, a corresponding conventional lateral dimension is indicted by the dashed lines 264C. For example, the conventional width 264C may substantially correspond to a desired cross-sectional area required for connecting to a package substrate, as previously explained. For instance, if a contact surface area with a diameter of approximately 100-30 μm may be required, i.e., the conventional width 264C would be selected to be approximately 100-30 μm, the width 264W of the opening 264A may be selected to be approximately 70 percent or less, such as 50 percent or less, relative to the lateral dimension of the required dimension at the contact surface of a metal pillar still to be formed. Moreover, a thickness 264T of the deposition mask 264 may be selected to correspond to a desired height of the portion of the metal pillar having the reduced lateral dimension. For example, the thickness 264T may correspond to approximately half of the final height of the metal pillar still to be formed, while in other cases a further reduced thickness may be selected, if desired.

The semiconductor device 200 as shown in FIG. 2a may be formed on the basis of the following process strategy. First, circuit elements in the device level 202 as well as the metallization system 210 including the metallization layers 220, 230 and 240 may be formed on the basis of any appropriate process strategy, wherein, if desired, a high degree of compatibility with desired technology standards and process techniques may be maintained. Thereafter, the final passivation layer 260 may be formed, for instance, by depositing corresponding dielectric materials, such as the sub-layers 261 and 262 and subsequently patterning the same by well-established lithography techniques. For example, the polyimide material 262 may be provided in the form of a photo sensitive material and may be patterned by a corresponding development process, followed by the etching of the layer 261. In other cases, a corresponding resist mask may be provided so as to etch through the final passivation layer 260 in order to expose a portion of the contact pad 241. If required, any appropriate barrier material 265 may be deposited in order to confine a corresponding reactive metal, such as copper, if a direct contact with material of the passivation layer 260 may be considered inappropriate. Moreover, the layer 265 may be advantageous in view of enhanced adhesion of a metal to be formed in the opening 263 and on exposed portions of a top surface 260S and sidewalls 260W of the final passivation layer 260. For this purpose, any appropriate materials, such as chromium, copper, tantalum, tantalum nitride and the like, or combinations of various materials, may be used. Thereafter, the deposition mask 264 may be provided, for instance in the form of a resist material, wherein the thickness thereof may be selected so as to obtain the desired target thickness 264T. In some illustrative embodiments, after providing the mask material, a planarization process may be performed to obtain the desired target thickness 264T. Thereafter, the opening 264A may be patterned by using an appropriate lithography mask in order to obtain the reduced width 264W.

Figure 2B:
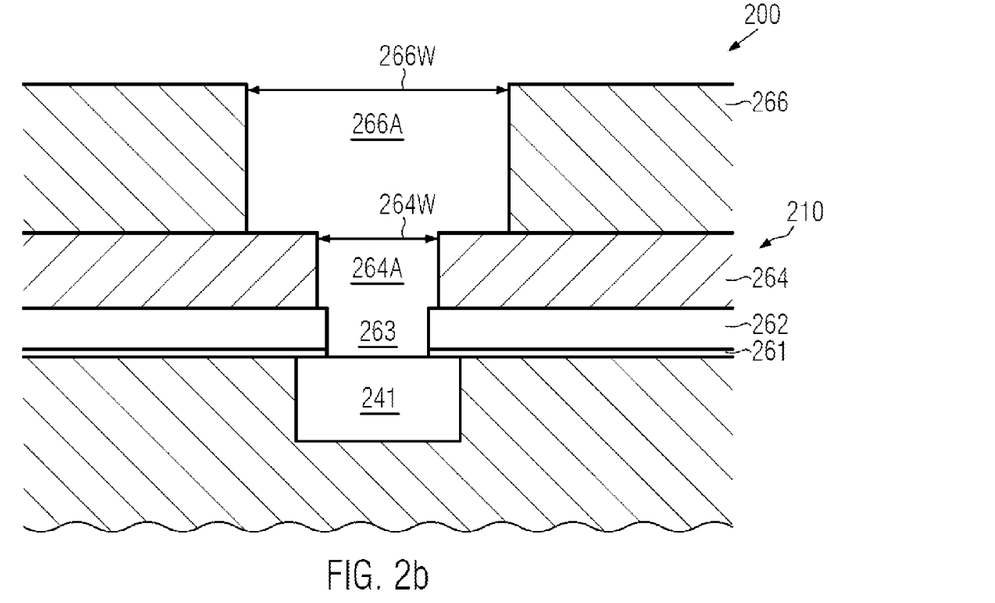

FIG. 2b schematically illustrates the semiconductor device 200 in a further advanced manufacturing stage. As illustrated, a second deposition mask 266 may be formed above the deposition mask 264 and may have formed therein an opening 266A that is aligned with the openings 264A and 263 and which may define the lateral position and the size and shape of a portion of a metal pillar still to be formed on the basis of the openings 264A, 266A. Consequently, the width 266W, as well as the overall shape of the opening 266A, may be selected so as to comply with the requirements for a metal pillar for connecting to a package substrate, as is also previously discussed with respect to the integrated circuit 150 in FIGS. 1a and 1b. Consequently, the width 266W may, in some illustrative embodiments, be in the range of 100-30 μm or even less, if highly sophisticated applications are considered. Due to the significantly increased dimension 266W compared to the dimension 264W, the metal pillar to be formed on the basis of the openings 266A, 264A may have a "nail-like" configuration in order to reduce the local torque forces exerted to the final passivation layer 260. Furthermore, the deposition mask 266 may be provided with any appropriate thickness to accommodate a thickness of an upper portion of the metal pillars still to be formed, possibly in combination with additional materials, such as a solder material and the like, if required. The deposition mask 266 may be provided in the form of resist material, which may be patterned by using well-established lithography techniques, i.e., by providing a positive resist or negative resist, depending on the process strategy, and removing an exposed portion or a non-exposed portion of the resist materials. Thereafter, if required, a wet chemical cleaning process may be performed to prepare the exposed surface of the contact pad 241, possibly in combination with a corresponding barrier material (not shown), for instance the barrier material 265 as explained with reference to FIG. 2a.

Figure 2C:
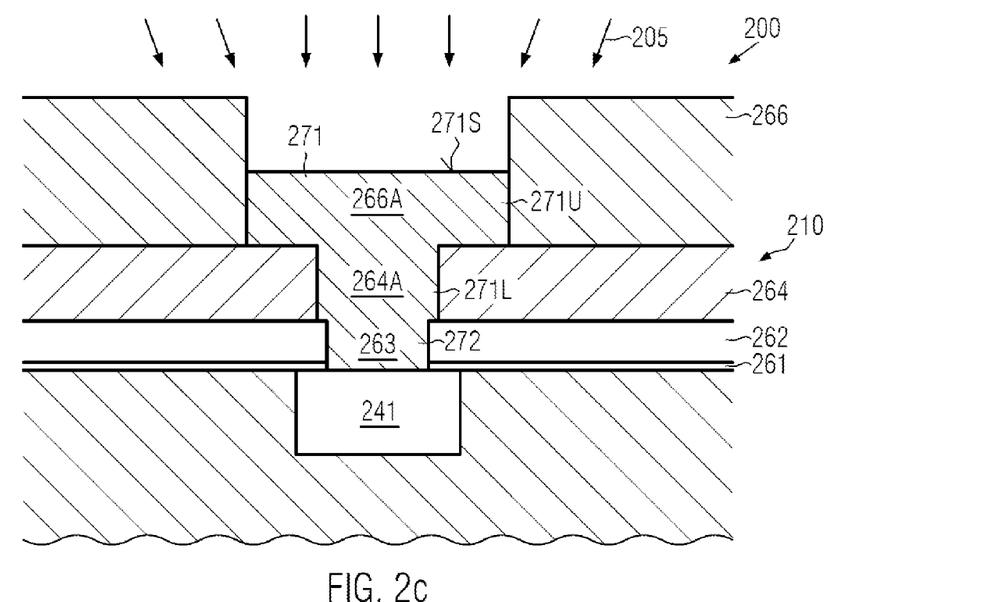

FIG. 2c schematically illustrates the semiconductor device 200 when exposed to a deposition ambient 205, during which an appropriate metal material may be filled into the openings 266A, 264A so as to form a metal pillar 271. It should be appreciated that, in the embodiments shown in FIGS. 2a-2c, a connection element 272 may be formed within the opening 263 during the deposition process 205 so that a connection element 272 and the metal pillar 271, comprising a lower portion 271L with dimensions defined by the opening 264A and an upper portion 271U having dimensions as defined by the opening 266A, may be formed on the basis of the same material. In other cases, the connection portion 272 may be formed separately from the metal pillar 271, if considered appropriate. For example, a specific material may be deposited by electrochemical deposition techniques on the basis of the final passivation layer 260 and the opening 263 and thereafter the first and second deposition masks 264 and 266 may be formed in order to provide the metal pillar 271 with the desired configuration and on the basis of a specific metal material.

The deposition process 205 may comprise any appropriate electrochemical deposition technique, such as electroless plating, electroplating and the like, wherein, in some illustrative embodiments, an electroless plating technique may be used without requiring a corresponding current distribution layer, which may have to be patterned after completing the metal pillar 271. For this purpose, a plurality of well-established deposition recipes are available. In some illustrative embodiments, additional cap materials may be formed on a top surface 271S if required, for instance in view of enhancing performance during a corresponding process for directly connecting to a contact pad of a package substrate in a later manufacturing stage and the like.

Figure 2D:
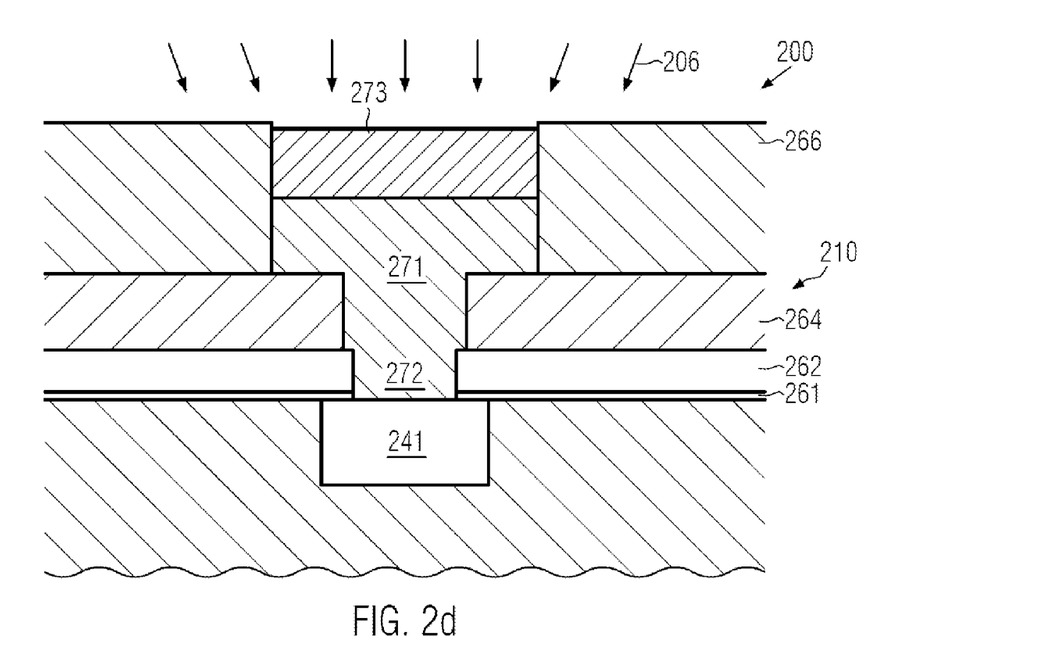

FIG. 2d schematically illustrates the semiconductor device 200 according to further illustrative embodiments in which a further material 273, for instance in the form of a solder material, such as a lead-free solder material, may be deposited during a deposition process 206, such as an electrochemical deposition process, for which well-established deposition recipes are available. For this purpose, a thickness of the deposition mask 266 may be appropriately selected to accommodate the metal pillar 271, i.e., the upper portion 271U (FIG. 2c) thereof, and a desired thickness of the material 273. Thereafter, the deposition masks 266 and 264 may be removed by any appropriate etch techniques, such as plasma stripping and the like, followed by any further etch processes to remove portions of current distribution layers, if provided, barrier materials and the like. It should be appreciated that, if such materials may have to be removed from the final passivation layer 260, appropriate isotropic etch recipes may be used, so that the shadowing effect of the upper portion 271U may not negatively affect the efficient removal of any such materials.

Figure 2E:
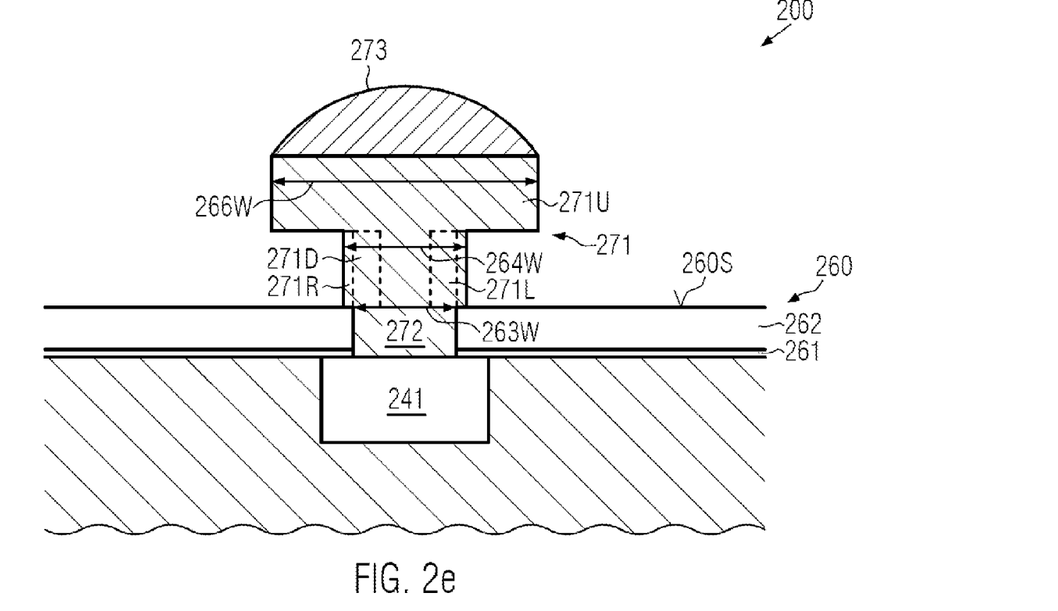

FIG. 2e schematically illustrates the semiconductor device 200 in a further advanced manufacturing stage according to some illustrative embodiments. As illustrated, the device 200 may comprise the metal pillar 271, including the upper portion 271U and the lower portion 271L with the respective lateral dimensions 266W and 264W that may be selected as specified above. Moreover, in the embodiment shown, the additional material 273 in the form of a solder material may be formed above the metal pillar 271 and may, in the embodiment shown, have an enhanced shape obtained upon reflowing the previously deposited solder material. In other embodiments, the metal pillar 271 may be provided without an additional solder material, as illustrated in FIG. 2c, or the reflowing of the solder material 273, if provided, may be omitted, as shown in FIG. 2d. As illustrated, in some embodiments, the reduced lateral dimension 264W may be selected so that at least a portion of the metal pillar 271 may "rest" above the final passivation layer 260, as indicated by the portion 271R. In this case, due to the overall reduced width 264W, the corresponding mechanical forces acting on the surface of the final passivation layer 260 may be reduced, as previously explained. Consequently, a corresponding local mechanical stress acting on any materials positioned below the final passivation layer 260 may also be reduced, thereby reducing the probability of creating defects, such as delamination, cracks and the like. In other illustrative embodiments, the dimension 264W may be selected so as to substantially correspond to a lateral dimension 263W of the connection element 272, thereby also reducing the resulting locally occurring forces acting on the final passivation layer 260. In still other illustrative embodiments, the lateral dimension 264W may be selected less than the dimension 263W, as indicated by 271D, thereby substantially completely avoiding an interaction of the metal pillar 271 with the surface 260S of the passivation layer 260. It should be appreciated that a corresponding variation of the lateral width 264W may be accomplished by appropriately selecting the width of the opening 264A of the deposition mask 264 (FIG. 2b).

Figure 2F:
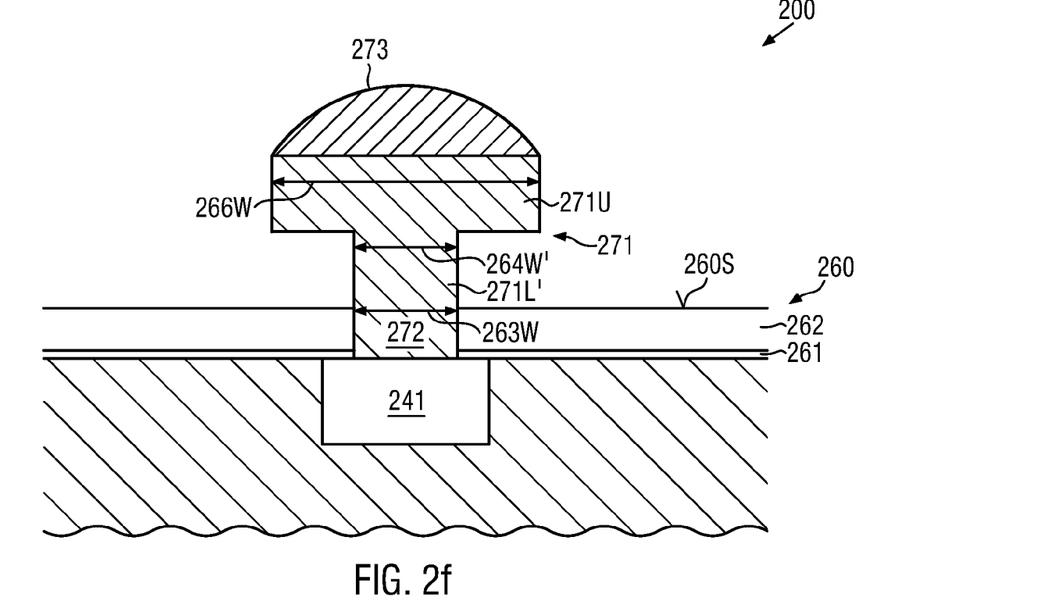

FIG. 2f schematically illustrates some embodiments of the semiconductor device 200 in the further advanced manufacturing stage shown in FIG. 2e. FIG. 2f shows embodiments in which the dimension 264W' of the lower portion 271L' may be selected so as to substantially correspond to the lateral dimension 263W of the connection element 272, thereby also reducing the resulting locally occurring forces acting on the final passivation layer 260. It should be appreciated that a corresponding variation of the lateral width 264W' may be accomplished by appropriately selecting the width of the opening 264A of the deposition mask 264 (FIG. 2b).

Figure 2G:
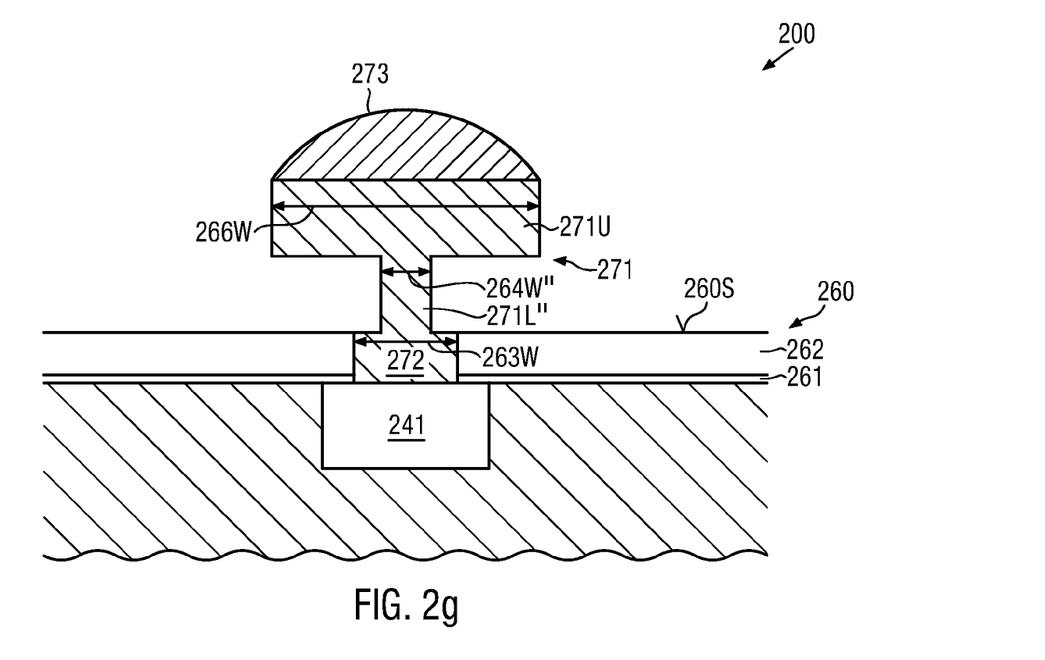

FIG. 2g schematically illustrates some embodiments of the semiconductor device 200 in the further advanced manufacturing stage shown in FIG. 2e. FIG. 2g shows embodiments in which the lateral dimension 264W" of the lower portion 271L" may be selected less than the dimension 263W, thereby substantially completely avoiding an interaction of the metal pillar 271 with the surface 260S of the passivation layer 260. It should be appreciated that a corresponding variation of the lateral width 264W" may be accomplished by appropriately selecting the width of the opening 264A of the deposition mask 264 (FIG. 2b).

As a result, the present disclosure provides semiconductor devices and manufacturing techniques in which the local forces at an interface between the surface of a passivation material and a metal pillar may be reduced by reducing the lateral dimension of a lower portion of the metal pillar, while maintaining a desired surface area for connecting to a package substrate at an upper portion thereof. Consequently, any desired material having an increased stiffness compared to conventional solder materials may be used, such as copper, copper alloys, nickel and the like, while also providing the possibility of using sophisticated dielectric materials in the metallization system without compromising the overall connectivity of the metal pillar structure.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
   a metallization system formed above a substrate, said metallization system comprising a final passivation layer; and
   a metal pillar extending from said final passivation layer, said metal pillar being in contact with a contact pad formed in said metallization system and having at least three lateral dimensions:
   a first lateral dimension at a top surface of said final passivation layer, wherein the top surface is opposite the contact pad,
   a second lateral dimension at a top surface of the metal pillar, said first lateral dimension being less than said second lateral dimension, and
   a third lateral dimension for a portion of the metal pillar formed in an opening in the final passivation layer, wherein the third lateral dimension is substantially equal to a lateral dimension of an opening formed in a final passivation layer, wherein said first lateral dimension is less than or equal to the third lateral dimension.

2. The semiconductor device of claim 1, wherein said opening in said final passivation layer is filled with a contact metal connecting said metal pillar with said contact pad.

3. The semiconductor device of claim 2, wherein the third lateral dimension for the portion of the metal pillar is substantially equal to said first lateral dimension.

4. The semiconductor device of claim 1, wherein the third lateral dimension for the portion of the metal pillar is 70% or less of said second lateral dimension.

5. The semiconductor device of claim 2, wherein said contact metal and said metal pillar are comprised of the same metal-containing material.

6. The semiconductor device of claim 1, further comprising a solder material formed above said top surface of said metal pillar.

7. The semiconductor device of claim 6, wherein said solder material is provided as a reflown solder material.

8. The semiconductor device of claim 1, wherein said metal pillar comprises copper.

9. The semiconductor device of claim 1, wherein said second lateral dimension of said metal pillar is approximately 30-100 μm.

10. The semiconductor device of claim 1, wherein a value of said first lateral dimension is approximately 50 percent or less relative to said second lateral dimension.

11. A method, comprising:
    forming a metal contact in an opening of a final passivation layer of a metallization system of a semiconductor device;
    forming a first deposition mask above the metal contact in the final passivation layer, said first deposition mask having a first opening with a first width that is less than or equal to a lateral dimension of the metal contact;
    forming a second deposition mask above said first deposition mask, said second deposition mask having a second opening aligned to said first opening, said second opening having a second width that is greater than said first width; and
    forming a metal pillar by depositing a material comprising a metal using said first and second deposition masks.

12. The method of claim 11, wherein forming said first and second deposition masks comprises forming a first resist mask and forming a second resist mask on said first resist mask.

13. The method of claim 11, further comprising forming the opening in said final passivation layer, wherein said opening of the final passivation layer has a width that defines the lateral dimension of the metal contact, and wherein the width is less than said second width.

14. The method of claim 13, wherein said width of the opening of said final passivation layer is greater than said first width.

15. The method of claim 11, further comprising forming a solder material above a top surface of said metal pillar.

16. The method of claim 15, further comprising reflowing said solder material prior to connecting said semiconductor device to a package substrate.

17. The method of claim 11, wherein said second width is approximately 100 μm or less.

18. A method of forming a semiconductor device, the method comprising:
   forming a final passivation layer above a plurality of metallization layers;
   forming an opening in said final passivation layer to expose a portion of a contact pad; and
   forming a metal pillar so as to extend from said final passivation layer, said metal pillar having at least three lateral dimensions:
      a first lateral dimension at a top surface of said final passivation layer,
      a second lateral dimension at a top surface thereof, said first lateral dimension being less than said second lateral dimension, and
      a third lateral dimension for a portion of the metal pillar formed in an opening in the final passivation layer, wherein the third lateral dimension is substantially equal to a lateral dimension of an opening formed in a final passivation layer, wherein said first lateral dimension is less than or equal to the third lateral dimension.

19. The method of claim 18, wherein said first lateral dimension is less by at least 50 percent.

20. The method of claim 18, wherein forming said metal pillar comprises forming a first deposition mask above said final passivation layer and forming a second deposition mask above said first deposition mask, wherein said first deposition mask has a first opening aligned to said opening of the final passivation layer and said second deposition mask has a second opening aligned to said first opening.

21. The method of claim 20, wherein said first and second deposition masks are provided as resist masks.

22. The method of claim 20, wherein the metal material is filled in said first and second openings and said opening of said final passivation layer in a common deposition process so as to form said metal pillar.

23. The method of claim 18, wherein said metal pillar is formed of a copper-containing material.

24. The method of claim 18, further comprising forming a solder material above said top surface of the metal pillar.

25. The method of claim 24, wherein said solder material and said metal pillar are formed on the basis of a common deposition mask.

* * * * *